AGC FOR BROADBAND PARAMETRIC AMPLIFIER

Filed Oct. 26, 1966

INVENTOR
James W. Daniel, Jr.
BY Edward J. Norton
Attorney

United States Patent Office 3,388,263
Patented June 11, 1968

3,388,263
AGC FOR BROADBAND PARAMETRIC AMPLIFIER

James W. Daniel, Jr., Cherry Hill, N.J., assignor to Radio Corporation of America, a corporation of Delaware Filed Oct. 26, 1966, Ser. No. 589,574
7 Claims. (Cl. 307—88.3)

Figure 1:
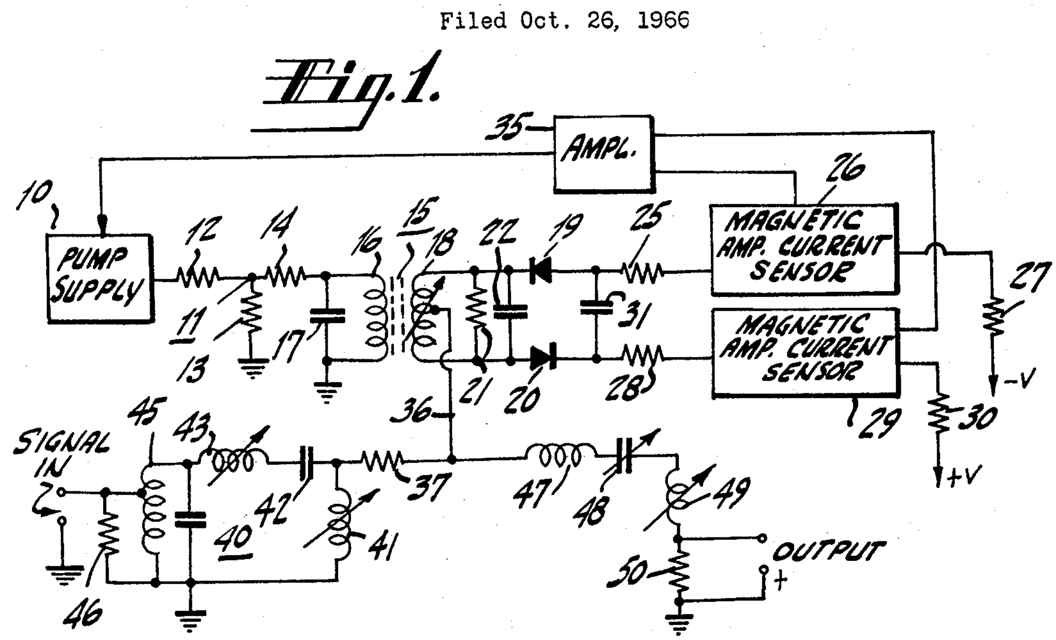

This invention relates to parametric amplifiers and more particularly to an improved automatic gain control circuit for a broad band parametric amplifier.

Wide band, radio frequency receivers require that the first mixer-amplifier stage have a suitable saturation level and low intermodulation products. This requirement is necessary because of the possibilities of large multiple in-band signals. Another important feature that a good radio frequency receiver should possess is that it have a large dynamic range. The prior art has suggested the use of a parametric amplifier up-convertor to fulfill the function of the mixer. The parametric up-convertor has been shown to be a low noise device and particularly suitable for this application. Such a parametric device usually consists of a reactance circuit including a first tuned circuit which is referred to as the signal circuit, a second tuned circuit designated as the idler circuit and a variable, non-linear reactance element such as a varactor or ferrite device connected in common to the two tuned circuits. In conjunction with the signal and idling circuits there is also a pump oscillator or source whose function is to generate a signal which varies the reactance of the variable device at a fixed frequency.

The amplification of a parametric amplifier or up-convertor device operating in a parametric mode depends to a large extent on regeneration. As can be shown from the Manley-Rowe equations, regeneration and gain are a function of the pump oscillator's power which is applied to the variable reactance element. It is possible then that variations in the pump oscillator output power which controls the gain will cause the amplifier to go into oscillation. It is desirable therefore to control the pump oscillator power in order to keep the gain of the parametric device constant and therefore maintain the parametric device in a stable condition. Such techniques have been utilized in prior art devices. However, the gain problem associated with this regeneration is associated with another important feature of the amplifier and that is the bandwidth. In the past while parametric amplifiers have operated with feedback techniques at relatively constant gain, they have been narrow band devices. Hence in order to cover any suitable range of frequency operation, either a multiplicity of parametric amplifiers or convertors were used to cover the desired band or some other broad banding scheme had to be employed. The introduction of such prior art schemes tended to effect the amplitude response of the parametric amplifier and hence oscillations due to regeneration predominated.

It is therefore an object of the present invention to provide an improved parametric amplifier capable of stable gain operation.

It is another object to provide an improved parametric amplifier capable of wide band operation.

Another object is to provide an improved parametric amplifier capable of extreme sensitivity.

Still a further object is to provide a parametric device which automatically compensates for the level of pump current.

These and other objects are accomplished in one embodiment of the invention by using a pump oscillator or source providing controllable pump power. The pump source is coupled to a circuit including a variable reactance (non-linear) device such as a varactor diode. Also coupled to the variable reactance device is a signal circuit and an idling circuit. The output of the parametric device is coupled to a current sensing circuit. This circuit senses the direct current (D.C.) in the non-linear device at the beginning of conduction, and the resulting signal is used to control the pump power supplied by applying the signal to a suitable pump attenuator or control associated with the pump source. This procedure tends to stabilize the gain of the parametric amplifier and allows the non-linear device to become useable over a wide bandwidth.

The above-mentioned and other features and objects of this invention will become more apparent by reference to the following description taken in conjunction with the accompanying drawing in which FIGURE 1 is a schematic diagram of an embodiment of a parametric circuit and control elements in accordance with the principles of this invention.

Figure 2:
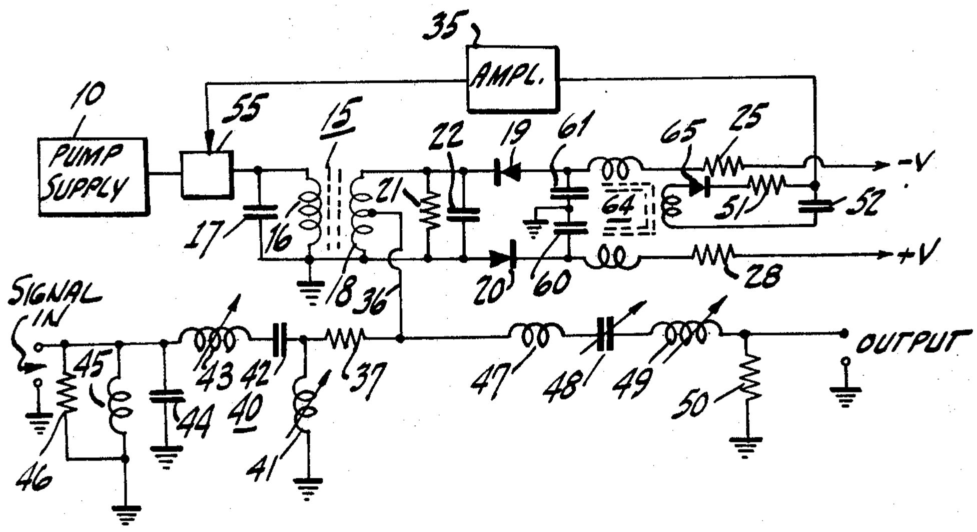

FIGURE 2 is a schematic diagram of a further embodiment providing a parametric device which utilizes self-biasing to control the degree of pumping.

Referring to FIGURE 1, numeral 10 refers to a source of pump oscillations which may be a transistor oscillator circuit or which may be a transistor oscillator circuit followed by a series of frequency multipliers in order to obtain a pump supply of the desired operating frequency and amplitude. The pump supply 10 is coupled to a resistive T network 11 which comprises resistors 12, 13 and 14. The function of this network 11 is to provide an impedance match between the pump oscillator 10 and the primary 16 of transformer 15. The primary 16 of the transformer 15 is tuned by a means of a capacitor 17 to be resonant at the pump frequency. The secondary 18 of the transformer 16 is coupled at one end to the cathode of a non-linear, variable capacitance diode 19. The other end of transformer 18 is coupled to the anode of another non-linear variable capacitance diode 20. The function of the diodes or varactors 19 and 20 is to provide a variable capacitance which varies in accordance with the frequency of the pump supply 10 and hence are parametric elements. It is noted that other devices might be employed in lieu of diodes 19 and 20, such as hypershunt varactors, and so on.

Shunted across the secondary winding 18 is a resistor 21 and a capacitor 22. The function of capacitor 22 is to tune the secondary of transformer 15 to the pump frequency. The function of resistor 21 is to slightly lower the Q of the resonant circuit formed by the secondary 18 and the capacitor 22 to prevent spurious ringing of this circuit. The anode of the varactor 19 is coupled to a resistor 25 with the other end of the resistor 25 being coupled to a magnetic amplifier current sensor 26. The magnetic amplifier is used to detect current sensor 26 small magnitude current fluctuations through the varactor diode 19. Another current sensing device capable of detecting current variations of 1 microamp could be used instead of 26. Another terminal of the magnetic amplifier current sensor 26 is coupled through a resistor 27 to a source of negative potential to provide a bias for varactor diode 19. The cathode of varactor 20 is connected to one end of a resistor 28 which is of the same order of magnitude as resistor 25. The other end of resistor 28 is coupled to an input terminal of a magnetic amplifier current sensor 29 which is identical to the current sensor 26. Another terminal of current sensor 29 is coupled by a resistor 30 to a source of positive potential which serves as a biasing source for varactor diode 20. Also shown connected from the anode of diode 19 to the cathode of diode 20 is a capacitor 31 which serves as a bypass capacitor. The capacitor 31 may also be chosen to be two capacitors with their common terminal grounded and then used as a filter capacitor to provide self-bias for diodes 19 and 20. This will be more fully described in conjunction with FIG- URE 2. An additional terminal is provided for each of the current sensors 26 and 29. These terminals are coupled to an amplifying device 35. The output of the amplifier 35 is fed back to a control terminal of the pump supply 10.

Thus far we have traced through the variable reactance elements of the parametric amplifier and have shown the current sensors and the feedback path to the pump supply. One terminal of a resistor 37 is coupled by a lead 36 to a point on the secondary of the transformer 15 which may be the center tap of the transformer 15. The other terminal of the resistor 37 is coupled to the junction of a variable inductor 41 and a capacitor 42. The opposite terminal of the variable inductor 41 is returned to a point of reference potential such as ground. The other terminal of capacitor 42 is coupled to a terminal of another variable inductor 43. The other terminal of variable inductor 43 is coupled to one terminal of a capacitor 44 and one terminal of a variable inductor 45. The other terminals of capacitor 44 and inductor 45 are coupled together and are returned to a point of reference potential such as ground. Also shown coupled in shunt with a portion of inductor 45 is a resistor 46. One end of resistor 46 serves as the signal input to the parametric amplifier. This input may be furnished from a source of frequencies such as an oscillator or in the case of a receiver would be coupled to an antenna. In the latter case, a function of resistor 46 would be to provide an impedance match between the signal input circuit and the antenna element in order to reduce the standing wave ratio. The circuit 40 just described is a bandpass filter designed as a Butterworth circuit and whose elements are designed to accommodate a desired spectrum of frequencies. The function of resistor 37 is to maintain the impedance of the signal circuit 40, as viewed by the variable reactance circuit, as consistent as possible in order to prevent negative resistance from shunting the signal circuit 40 and causing the device to oscillate.

Also coupled to lead 36 is one terminal of an inductor 47. The other terminal of inductor 47 is coupled to one terminal of a variable capacitor 48 whose other terminal is coupled to another variable inductor 49 which is coupled to a resistor 50. The opposite terminal of resistor 50 is coupled to a source of reference potential or ground. This circuit comprising inductor 47, capacitor 48, inductor 49, and resistor 50 is the idler circuit and is usually tuned to the difference in frequency between the pump and the signal in case of a down-convertor or to the sum of the signal and pump frequencies in the case of the parametric up convertor. The output from the amplifier can be taken from across the resistor 50.

The circuit of FIGURE 1 operates as follows. Assume the pump supply 10 is operating at a certain level of voltage and at a specified frequency. When the peak pump voltage across the diodes 19 and 20 exceeds the bias voltage determined by resistor 25, 27, 28 and 30 and the sources of positive and negative potential, the variable diode 19 or 20 will start to conduct during that portion of the pump cycle when the anode of the respective diode is positive with respect to the cathode. Thus by sensing the D.C. diode current at the beginning of the diode conduction by means of a magnetic amplifier or other current sensor 26 or 29 and using the resulting signal which is proportional to the current to control the pump power, the same degree of pumping can be maintained over a wide bandwidth. Hence if the pump power is made to vary in accordance with the frequency characteristics of the device one can obtain stable operation over a wide band. The fact that the D.C. current through varactor diode 19 or 20 is detected at the point when they just begin to rectify, and this being the point at which the pump is controlled, serves to operate the parametric amplifier at the point of maximum sensitivity. Operation at this point tends to stabilize the gain of the parametric amplifier and allows negative resistance devices to become useable over wide bandwidths. In general negative resistance parametric amplifiers have not previously been used for wide bandwidth because of the stability problem aforementioned. If one utilizes the circuit shown in FIGURE 1 and chooses the values of resistors 25, 27, 28, and 30 so that the diodes 19 and 20 draw about one microamp of current then the amplifier will operate with practically no degradation in noise figure or linearity. Because the device operates and is controlled at the point where conduction just commences the devices will operate over a wider range and hence the dynamic range of the device is enhanced. Currents of this order of magnitude can be sensed conveniently by magnetic amplifiers and multipliers. This sensed current then can be amplified by a conventional amplifying circuit as amplifier 35 and this signal may be fed back in a desired manner to control the amplitude of the pump supply. The signal network filter 40 can be designed as a Butterworth filter which presents in effect a parallel capacitance to tune the pole associated with inductor 47 in conjunction with the shunt capacity due to the varactor diodes and the idling network, thus preventing oscillations.

Two parametric up-convertors have been designed according to the above technique. One operates over a band of input signals from 2 to 8 megacycles and the other operates over a band of input signals from 8 to 30 megacycles. The output intermediate frequency or idler frequency for the lower band is chosen to be 31 mc. with a pump frequency which is varied from 33 to 39 mc. for the lower band of signal input frequencies. For the high band of 8 to 30 mc., the pump frequency is varied from 83 to 105 mc. and the intermediate frequency or idler frequency is 75 mc. Thus the circuit operates as a frequency up-convertor for both the lower and high bands. The upper sideband is selected for the lower band operation and the lower sideband is selected for the higher band of signal input frequencies. The following table represents some typical values.

| | Low Band 2 to 8 mc. | High Band 8 to 30 mc. |
|---|---|---|
| Resistor 12 | 10 ohms | 10 ohms. |
| Resistor 13 | 220 ohms | 220 ohms. |
| Resistor 14 | 10 ohms | 10 ohms. |
| Capacitor 17 | 57 ohms | 27 ohms. |
| Resistor 21 | 870 ohms | 820 ohms. |
| Capacitor 22 | 56 micro-micro farads | 30 micro-micro farads. |
| Capacitor 31 | .1 μf. | .1 μf. |
| Resistor 25 | 2.2 meg | 2.2 meg. |
| Resistor 28 | 2.2 meg | 2.2 meg. |
| Resistor 27 | 100 kilohms | 100 kilohms. |
| Resistor 30 | do | Do. |
| Resistor 46 | 220 ohms | 220 ohms. |
| Inductor 45 | 21 micro henries | 1.8 micro henries. |
| Capacitor 44 | 57 micro-micro farads | 56 micro-micro farads. |
| Inductor 43 | 6.1 micro henries | .76 micro henries. |
| Capacitor 42 | 160 micro-micro farads | 120 micro-micro farads. |
| Inductor 41 | 21 micro henries | 1.8 micro henries. |
| Capacitor 48 | 1-10 micro-micro farads | 1-10 micro-micro farads. |
| Diodes 19 and 20 | VA 209 | VA 209. |

Both of the circuits built according to the values specified in the above table had a band width of two octaves and an overall system sensitivity of .6 micro volts open circuit.

If reference is made to FIGURE 2, there is shown another embodiment of the invention. Here the output voltage from the parametric amplifier is sampled by a current transformer network 64 and rectified by a circuit including a diode 65, a resistor 51 and a capacitor 52. The D.C. signal obtained is then amplified by means of the conventional amplifier 35, and this signal is fed back to a pump attenuator 55. The attenuator 55 serves to match the impedance of the pump supply 10 to the transformer 15 and is also made to be voltage sensitive. Such a device as 55 could be varactor diodes or some other voltage sensitive device. With respect to the signal circuit 40 and the idling network, the circuit is the same as that described in FIGURE 1. There is shown in FIGURE 2 in lieu of the capacitor 31 in FIGURE 1 two capacitors 60 and 61 whose common terminal is coupled to a point of reference potential or ground. Each capacitor 60 and 61 in conjunction with the respective parametric diode 19 or 20 serves as a filter in the rectifying circuit, and the voltage across these capacitors 60 and 61 is used to self-bias the diodes 19 and 20. This in turn introduces another degree of control and hence affords another control factor culminating in better device stability.

In summary, a significant feature is the provision in a parametric amplifier of the capability to control the pump current or pump power using a current sensing device which is capable of operation at very low levels such as a magnetic amplifier. The arrangement of the invention further permits the use of self-bias control for the parametric devices. A parametric device is provided which is operable over two octaves of bandwidth while still maintaining a high system sensitivity and low noise operation.

What is claimed is:

1. A broad band parametric amplifier comprising,
(a) a non linear reactance device,
(b) a first frequency signal source coupled to said device to pump said device at said first frequency,
(c) a source of broad band signal frequencies coupled to said device,
(d) means coupled to said device for supporting a third idler frequency equal to a beat frequency of said signal frequencies and said first frequency to enable amplification of said signal frequencies,
(e) means for detecting variations in the magnitude of current through said device to provide a control signal, which is solely determined by said current variations,
(f) and means coupled to said first frequency signal source and responsive to said control signal to determine the amplitude of said first signal over the broad band of said signal frequencies so as to reduce said current variations.

2. A broad band parametric amplifier comprising,
(a) a non linear reactance device,
(b) means including a pump oscillator coupled to said device to enable said device to operate as a parametric amplifier,
(c) current sensing means coupled to said amplifier's output to provide a control signal, which is solely determined by said output level,
(d) means coupled to said current sensing means and said pump oscillator to adjust the level of said oscillator according to said control signal so as to reduce any changes in said output level.

3. A broad band parametric convertor comprising,
(a) a non linear reactance diode,
(b) means including a pump oscillator coupled to said diode to enable said diode to operate as a parametric convertor,
(c) means coupled to said diode to provide a signal when said non linear diode begins to conduct,
(d) means coupled to said pump oscillator and responsive to said signal to control said pump power when said diode begins to conduct so as to reduce changes in the point at which said diode begins to conduct.

4. A broad band parametric device comprising,
(a) a first non linear reactance diode,
(b) a second non linear reactance diode,
(c) means including a pump oscillator coupled to said diodes to enable parametric operation of said diodes,
(d) first current sensing means coupled in series with said first diode to provide a first signal when said first diode begins to conduct,
(e) second current sensing means coupled in series with said second diode to provide a second signal when said second diode begins to conduct,
(f) means coupled to said first and second current sensing means and said pump oscillator to regulate said oscillator's amplitude in accordance with said first and second signals to reduce changes in the respective points at which said first and second diodes begin to conduct.

5. The parametric device according to claim 4 wherein said first and second current sensing means are magnetic amplifiers.

6. In a parametric amplifier including a first and second non linear reactance diode coupled to a pump oscillator and a signal and idler supporting circuit, the combination comprising,
(a) a current sensing device in series with one of said diodes to determine when said diode begins to conduct,
(b) means coupled to said current sensing device and said pump oscillator to provide control of said pump oscillator at the point when said diode begins to conduct so as to reduce changes in said point.

7. A parametric device for broad band operation comprising,
(a) a first and second non linear reactance diode,
(b) means including a pump signal circuit coupled to said diodes to enable operation of said diodes as a parametric device,
(c) a separate capacitor coupled to each diode in a manner to form a rectifying circuit which provides self-bias for said diodes,
(d) current sensing means in series with said diodes to sense when said diodes start to conduct and to provide a control signal, which is solely determined by said conduction current variations,
(e) means coupled to said current sensing means and said pump circuit and responsive to said control signal to control the amplitude of said pump signal and thereby the amount of said self bias on said diodes to reduce changes in the points at which said diodes start to conduct.

References Cited

UNITED STATES PATENTS

| | | | |
|---|---|---|---|
| 3,121,844 | 2/1964 | Glomb | 330—4.5 |
| 3,195,062 | 7/1965 | Murakami | 330—4.9 |
| 3,197,708 | 7/1965 | Pan | 330—4.9 |
| 3,304,511 | 2/1967 | Ulstad | 330—4.5 |
| 3,316,421 | 4/1967 | Biard | 307—88.3 |

FOREIGN PATENTS

| | | |
|---|---|---|
| 1,344,348 | 4/1963 | France. |
| 1,174,856 | 7/1964 | Germany. |

ROY LAKE, *Primary Examiner.*

D. R. HOSTETTER, *Examiner.*